US009632562B2

(12) United States Patent
Quach et al.

(10) Patent No.: US 9,632,562 B2
(45) Date of Patent: Apr. 25, 2017

(54) SYSTEMS AND METHODS FOR REDUCING VOLATILE MEMORY STANDBY POWER IN A PORTABLE COMPUTING DEVICE

(71) Applicant: QUALCOMM INCORPORATED, San Diego, CA (US)

(72) Inventors: Nhon Toai Quach, San Jose, CA (US); Virat Deepak, San Diego, CA (US); Oscar Cabral Arias, San Diego, CA (US); Yanru Li, San Diego, CA (US); Haw-Jing Lo, San Diego, CA (US); Michael Drop, San Diego, CA (US); Venkata Narayana Ramesh Pinnamaraju Durga, San Diego, CA (US); Moinul Khan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 93 days.

(21) Appl. No.: 14/616,720

(22) Filed: Feb. 8, 2015

(65) Prior Publication Data
US 2016/0148670 A1 May 26, 2016

Related U.S. Application Data

(60) Provisional application No. 62/082,434, filed on Nov. 20, 2014.

(51) Int. Cl.
G06F 1/32 (2006.01)
G11C 11/4074 (2006.01)
(Continued)

(52) U.S. Cl.
CPC .......... G06F 1/3275 (2013.01); G06F 1/3287 (2013.01); G11C 11/409 (2013.01);
(Continued)

(58) Field of Classification Search
CPC ............................ G06F 1/3275; G06F 1/3287
(Continued)

(56) References Cited

U.S. PATENT DOCUMENTS 5,524,248 A 6/1996 Parks et al.
6,199,139 B1 3/2001 Katayama et al.
(Continued)

FOREIGN PATENT DOCUMENTS

CN 1327311 C 7/2007

OTHER PUBLICATIONS

International Search Report and Written Opinion—PCT/US2015/060740—ISAEPO—Feb. 5, 2016.
(Continued)

Primary Examiner — Chun Cao
(74) Attorney, Agent, or Firm — Smith Tempel

(57) ABSTRACT

Various embodiments of systems and methods are disclosed for reducing volatile memory standby power in a portable computing device. One such method involves receiving a request for a volatile memory device to enter a standby power mode. One or more compression parameters are determined for compressing content stored in a plurality of banks of the volatile memory device. The stored content is compressed based on the one or more compression parameters to free-up at least one of the plurality of banks. The method disables self-refresh of at least a portion of one or more of the plurality of banks freed-up by the compression during the standby power mode.

30 Claims, 6 Drawing Sheets

(51) Int. Cl.
*G11C 11/409* (2006.01)
*H03M 7/30* (2006.01)

(52) U.S. Cl.
CPC ........... *G11C 11/4074* (2013.01); *H03M 7/30* (2013.01); *G06F 2212/1028* (2013.01); *G06F 2212/401* (2013.01); *Y02B 60/1225* (2013.01); *Y02B 60/1228* (2013.01); *Y02B 60/1282* (2013.01)

(58) Field of Classification Search
USPC .......................................... 713/323; 365/227
See application file for complete search history.

(56) References Cited

U.S. PATENT DOCUMENTS

| | | | | |
|---|---|---|---|---|
| 6,212,642 | B1* | 4/2001 | Seiler | G06F 9/4418 713/320 |
| 6,715,024 | B1 | 3/2004 | Lin | |
| 8,392,736 | B2* | 3/2013 | Vaden | G06F 1/3225 711/100 |
| 8,504,121 | B1 | 8/2013 | Pan | |
| 8,533,449 | B2 | 9/2013 | Bak et al. | |
| 8,589,650 | B2* | 11/2013 | Yokoya | G06F 1/3275 711/165 |
| 2007/0180187 | A1 | 8/2007 | Olson et al. | |
| 2007/0291571 | A1 | 12/2007 | Balasundaram | |
| 2011/0047326 | A1* | 2/2011 | Kaburlasos | G06F 12/0292 711/106 |
| 2011/0296095 | A1 | 12/2011 | Su et al. | |
| 2012/0117311 | A1 | 5/2012 | Hong | |
| 2012/0324251 | A1* | 12/2012 | Bolanowski | G06F 1/3203 713/300 |
| 2014/0089711 | A1* | 3/2014 | Balasundaram | G11C 5/14 713/323 |
| 2014/0310552 | A1 | 10/2014 | So et al. | |

OTHER PUBLICATIONS

International Preliminary Report on Patentability—PCT/US2015/060740, The International Bureau of WIPO—Geneva, Switzerland, Jan. 17, 2017 (150520WO)—nine pages.

* cited by examiner

SYSTEMS AND METHODS FOR REDUCING VOLATILE MEMORY STANDBY POWER IN A PORTABLE COMPUTING DEVICE

CROSS-REFERENCE TO RELATED APPLICATIONS

This application claims the benefit of the priority of U.S. Provisional Patent Application No. 62/082,434, entitled "Systems and Methods for Reducing Volatile Memory Standby Power in a Portable Computing Device" and filed on Nov. 20, 2014, which is hereby incorporated by reference in its entirety.

DESCRIPTION OF THE RELATED ART

Portable computing devices (e.g., notebooks, ultrabooks, cellular telephones, smart phones, tablet computers, portable digital assistants (PDAs), and portable game consoles) and wearable computing devices (e.g., smart watches, fitness trackers, sports and global positioning system (GPS) watches, heart rate monitors, and global positioning system (GPS) devices) continue to offer an ever-expanding array of features and services. Portable and wearable computing devices provide users with unprecedented levels of access to information, resources, and communications. To keep pace with these service enhancements, such devices have become more powerful and more complex. Portable and wearable computing devices now commonly include a system on chip (SoC) comprising one or more chip components embedded on a single silicon substrate (e.g., a plurality of central processing units (CPUs), graphics processing units (GPU), digital signal processors, etc.). The SoC is coupled to volatile memory, such as, for example, dynamic random access memory (DRAM). DRAM may include various types of double data rate (DDR) synchronous DRAM, including various standards for low power DDR (LPDDR) and graphics DDR (GDDR).

In many portable and wearable computing devices, DDR memory is typically put in a standby power or sleep mode to conserve battery power when the device is not active. Even in standby, however, DDR still consumes a significant amount of the total standby power budget. Standby power is often a key competitive metric for mobile devices because it directly impacts the user experience (e.g., battery life, days of use (DoU)). When in standby mode, the peripheral circuits in the DDR memory are powered down. A hardware state machine inside the memory is left awake to periodically refresh ("self-refresh") the rows in the DDR memory arrays to prevent corruption of the memory content. The self-refresh current is the key source of the power consumption in standby mode.

To reduce standby power, some existing solutions rely on software to compress all data content in the DDR and save the compressed content in a hard drive or flash memory. When exiting the standby mode and entering into the active mode, the compressed memory content (or memory image) is first retrieved from the hard drive or flash memory, decompressed, and then stored back into the DDR memory. Because the compression and decompression is performed by an application processor, the sleep period of the mobile device needs to be relatively long (e.g., on the order of hours in most cases) to make up for the power consumed in compressing and storing the compressed content into and retrieving and restoring from the hard drive or flash memory. With the hard drive, another drawback is its long access time, leading to long sleep or wake time. With flash memory, another drawback is that it has a limited number of program/erase (P/E) cycles. For example, to store 1 GB of compressed DDR contend in a two-bit MLC (multi-level cell) flash device, which has a typical 3000 PIE cycles, an implementation may require up to 16 GB of flash memory for redundancy because each GB of MLC flash memory can only be erased and written 3000 times. Yet another drawback is that many memory controllers perform bank interleaving, which means that the entire DDR content needs to be compressed or not at all. Other solutions rely on the operating system (O/S) killing off processes to free up the memory, which requires complicated software restructuring, among other drawbacks.

Accordingly, there is a need in the art for improved systems and methods for reducing DRAM memory standby power in a portable computing device.

SUMMARY OF THE DISCLOSURE

Various embodiments of systems and methods are disclosed for reducing volatile memory standby power in a portable computing device. One such method involves receiving a request for a volatile memory device to enter a standby power mode. One or more compression parameters are determined for compressing content stored in a plurality of banks of the volatile memory device. The stored content is compressed based on the one or more compression parameters to free-up at least one of the plurality of banks. The method disables self-refresh of at least a portion of one or more of the plurality of banks freed-up by the compression during the standby power mode.

Another embodiment is a system for reducing volatile memory standby power in a portable computing device. One such system comprises a dynamic random access memory (DRAM) device coupled to a DRAM controller. The DRAM device comprises a plurality of banks containing memory content. The DRAM controller comprises a DRAM compression component configured to bypass an address interleave component. The DRAM compression component comprises logic configured to: receive a request for the SoC or DRAM controller to enter a standby power mode; determine one or more compression parameters for compressing the memory content stored in the plurality of banks; compress the memory content based on the one or more compression parameters to free-up at least one of the plurality of banks; and disable self-refresh of at least a portion of one or more of the plurality of banks freed-up by the compression during the standby power mode.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Figure 1:
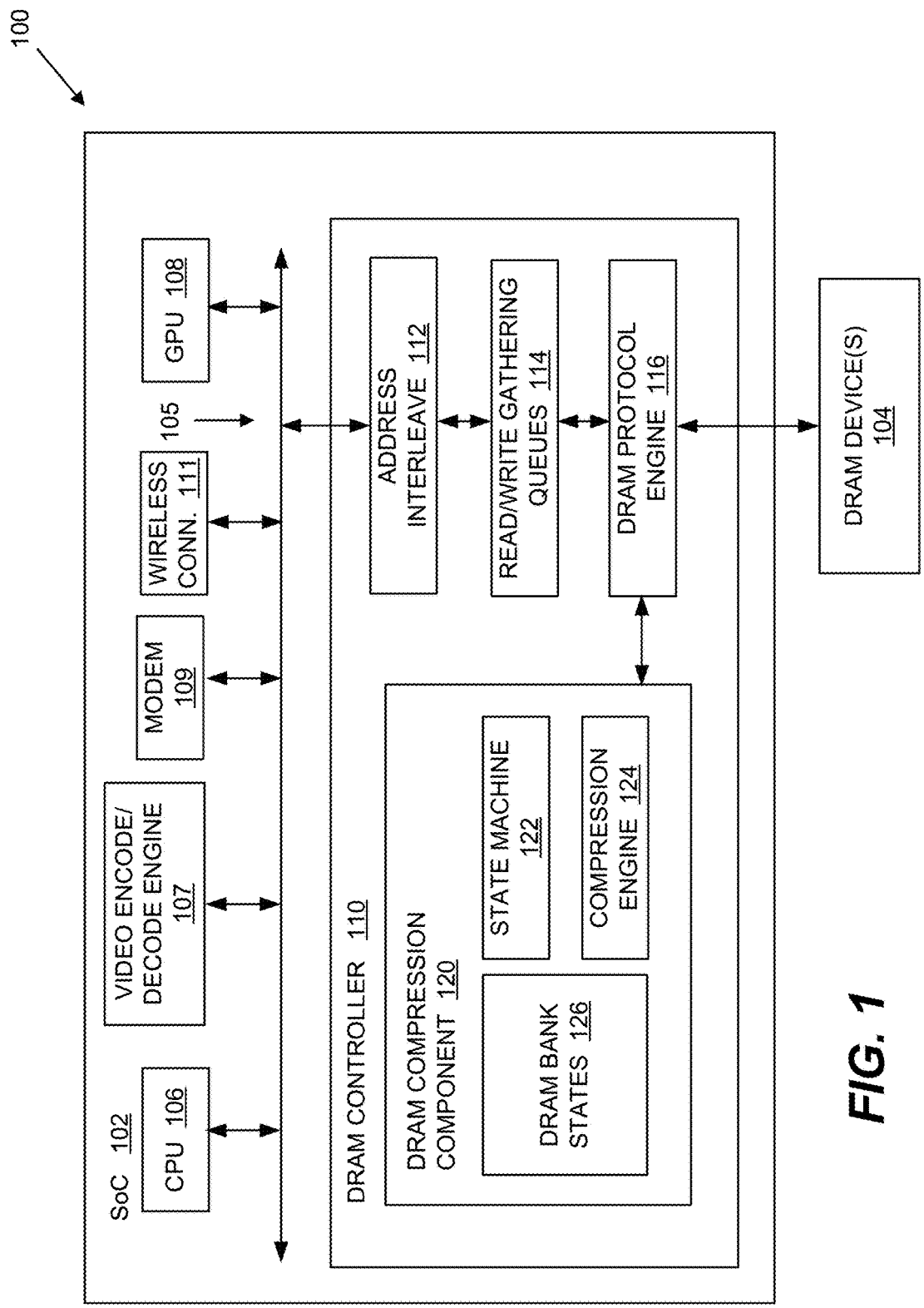
FIG. 1 is a block diagram illustrating an embodiment of a system for reducing DRAM memory standby power in a portable computing device.

FIG. 1 is a block diagram illustrating an embodiment of system 100 for reducing DRAM memory standby power in a portable computing device. It should be appreciated that the system 100 may be implemented in any computing device, including a personal computer, a workstation, a server, and a portable computing device (PCD). Suitable PCDs may comprise, for example, a mobile telephone, a portable digital assistant (PDA), a portable game console, a palmtop computer, a tablet computer, or a wearable computing device (e.g., a smart watch, a fitness tracker, a heart rate monitor, a GPS tracking device, etc.).

The system 100 comprises a system on chip (SoC) 102 coupled to volatile memory, such as, DRAM 104. DRAM 104 may comprise one or more memory integrated circuits. It should be appreciated that DRAM 104 may comprise various types of double data rate (DDR) synchronous DRAM, including various known interface standards for low power DDR (LPDDR) and graphics DDR (GDDR). The SoC 102 comprises one or more processing devices coupled to a DRAM memory controller 110 via, for example, a SoC bus 105. The processing devices or masters may comprise a central processing unit (CPU) 106, a graphics processing unit (GPU) 108, a digital signal processor (DSP), a video encoding/decoding engine 107, a modem 109, a wireless connectivity logic block 111, or any other memory client.

The DRAM controller 110 controls memory read/write transactions to DRAM 104. In an embodiment, the DRAM controller 110 comprises an address interleave logic 112, read/write gathering queues 114, a DRAM protocol engine 116, and a DRAM compression component 120. As known in the art, the address interleave logic 112 is configured to interleave read and write transactions to DRAM 104 by spreading memory addresses evenly across memory banks. In this manner, contiguous memory read and write transactions may use each memory bank in turn, resulting in higher memory throughputs due to reduced waiting time for memory banks to become available for desired operations. Read/write gathering queues 114 increase the utilization efficiency of the DRAM memory by grouping the reads and writes from the masters to the same page so they can be performed together as closely as possible. In this way, the cost of making a bank available (e.g., closing and/or opening the page in a bank) can be amortized across many read or write transactions from the masters. DRAM protocol engine 116 provides an interface to DRAM 104 so that all reads and writes are performed correctly meeting all the timing requirements as specified in the DRAM memory interface standard.

As described below in more detail, the DRAM compression component 120 is configured to compress the content of DRAM 104 and configure the memory device to stop the self-refresh of the bank(s) that are freed up. Because the freed-up bank(s) do not contain valid information, there is no need to self-refresh during standby mode, which reduces power consumption and extends battery life. In the embodiment of FIG. 1, the DRAM compression component 120 comprises a compression engine 124, a finite state machine 122, and one or more registers for storing DRAM bank compression states 126. As illustrated in FIG. 1, the DRAM compression component 120 may be configured to bypass the address interleave logic 112, thereby enabling the compression engine 124 to compress any of the banks in DRAM 104. It should be appreciated that the compression engine 124 may support any type of compression algorithm. In an embodiment, the compression algorithm comprises a lossless data compression algorithm, such as, for example, any of the known Lempel-Ziv (LZ) or other compression methods.

Figure 2:
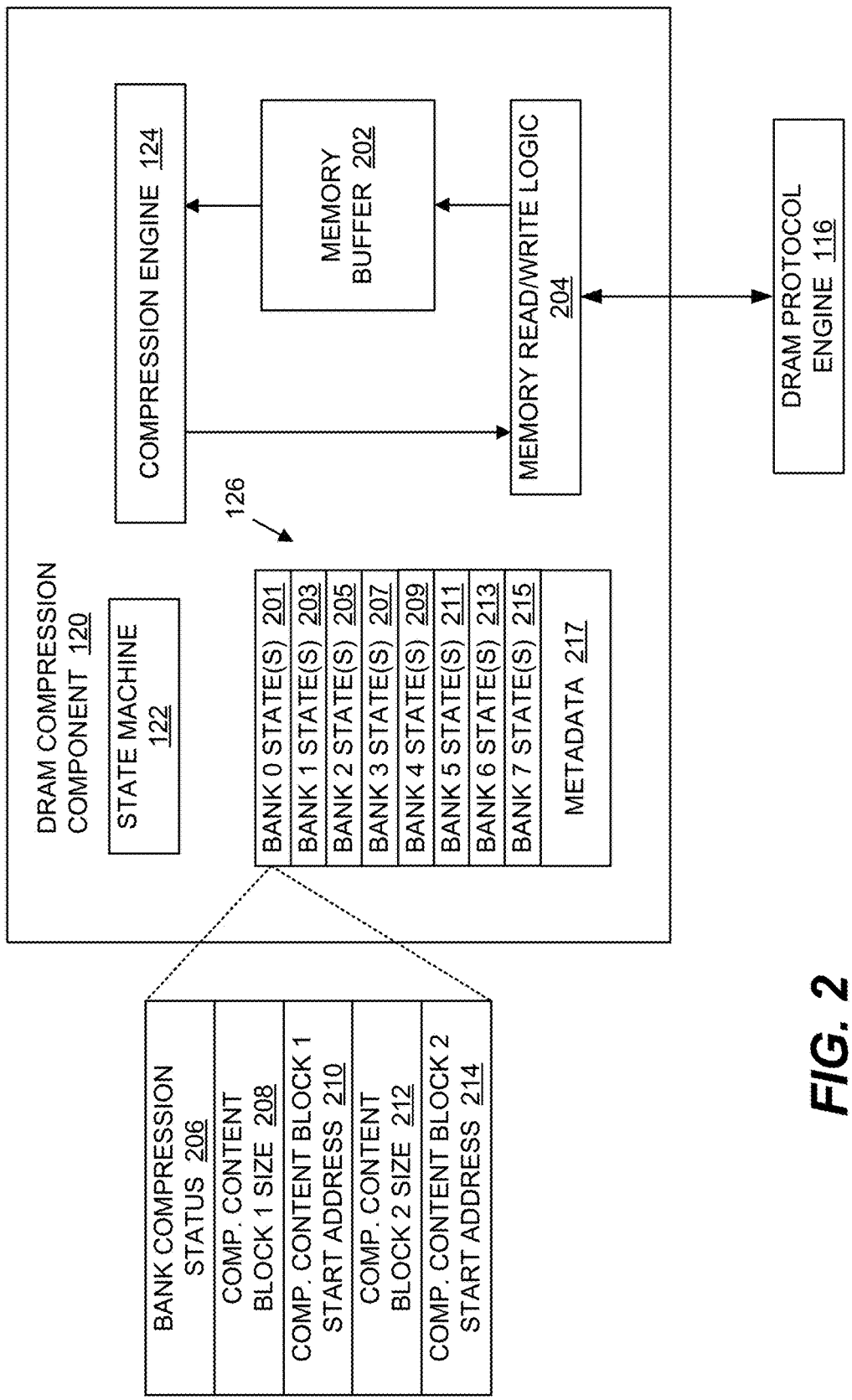
FIG. 2 is a block diagram illustrating an embodiment of the DRAM compression component in the system of FIG. 1.

The finite state machine 122 maintains state data for each bank in DRAM 104 identifying whether the bank is compressed, partially compressed, or uncompressed. In the partially compressed case, the location and size of the compressed content will also be recorded. In the example of FIG. 2, the DRAM 104 may comprise eight or more banks (bank 0-bank 7). States 201, 203, 205, 207, 209, 211, 213 and 215 correspond to bank 0, bank 1, bank 2, bank 3, bank 4, bank 5, bank 6 and bank 7, respectively. The bank states may be stored in one or more registers. As illustrated in FIG. 2, the state data for each bank may comprise a bank compression status 206 having a compressed, partially compressed, or uncompressed state. If a bank is in the compressed state, additional state data may be stored for managing compression/decompression, including, a size and a start address for one or more compression blocks. In FIG. 2, bank 0 is in the compressed state. A field 208 comprises a size for block 1 of the compressed content, and field 210 identifies a start address for block 1. A field 212 comprises a size for block 2 of the compressed content, and field 214 identifies a start address for block 2.

Figure 3:
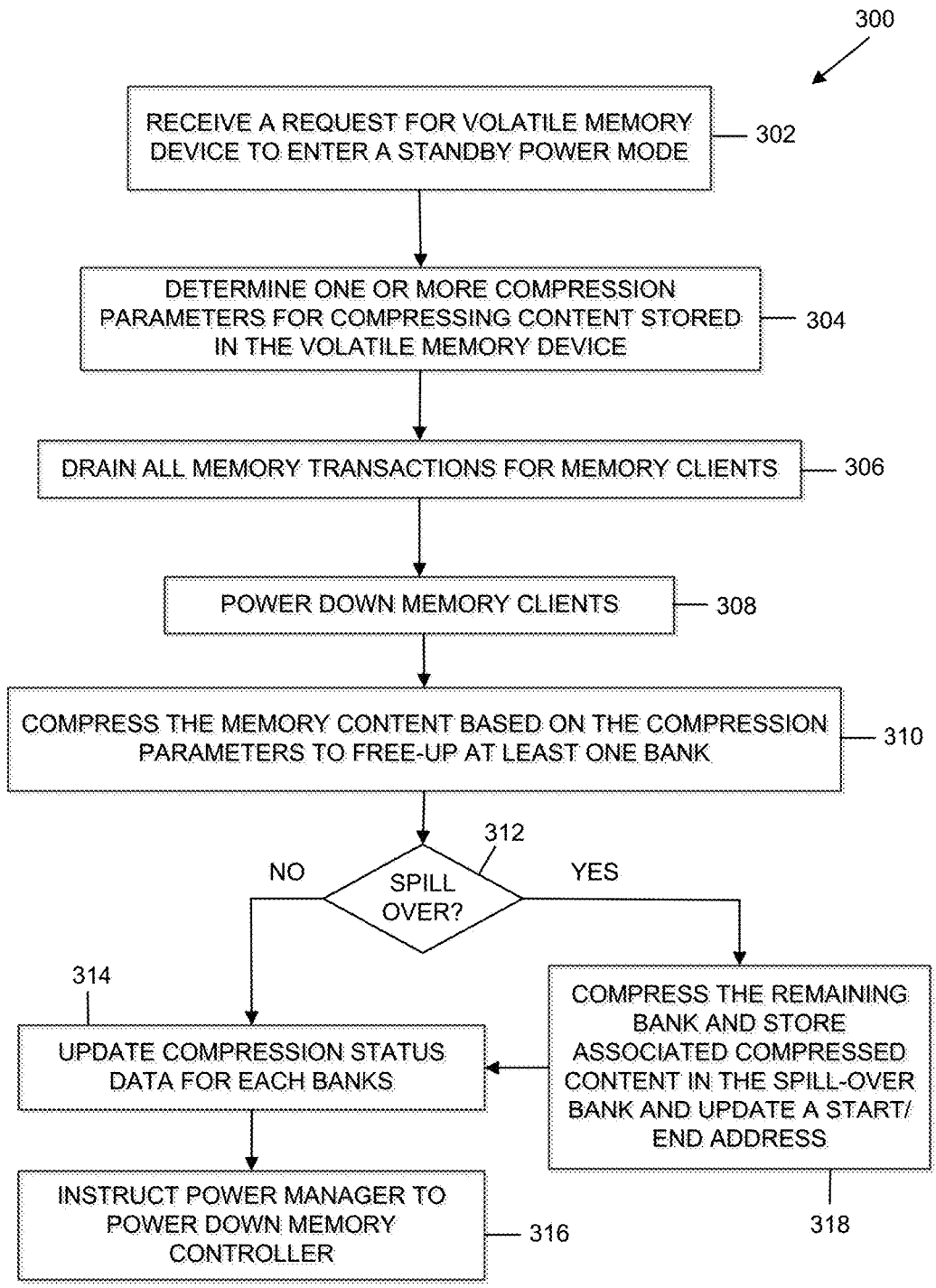
FIG. 3 is a flowchart illustrating an embodiment of a method implemented in the system of FIG. 1 for reducing DRAM memory standby power.

FIG. 3 illustrates an embodiment of a method 300 implemented by the DRAM compression component 120. At block 302, a request is received to put DRAM 104 in a standby power mode. It should be appreciated that the request to enter standby power mode for DRAM 104 may be initiated by a software command executing on the CPU master or the power manager or by a hardware finite state machine outside of the hardware compression engine on the SoC (not shown in the figure) after all masters are powered down. The finite state machine 122 may be configured with one or more compression parameters for compressing the content stored in the banks. The compression parameters may specify, for example, a size of a compression block, a number of banks to be compressed, a location of a spill-over bank, etc. The compression parameters may be provided to the DRAM compression component 120 or otherwise programmed or stored in the finite state machine 122. At block 304, the compression parameters are determined. At block 306, all memory transactions for the memory clients (e.g., CPU 106, GPU 108) are drained. When all the memory content is drained and stored in DRAM 104, the memory clients may be powered down (block 308). At block 310, the memory content is compressed based on the compression parameters. For example, assuming a compression ratio of 2:1, the content in two banks may be compressed into a single bank, which frees up a bank. If the compression algorithm does not yield spilt-over compressed content, the compression status data for the banks are updated (block 314) and a power manager is instructed to power down the DRAM controller 110. If, however, there is spilt-over content, the compression engine compresses (block 318) this remaining content and stores the resulting compressed content in the spill-over bank identified in the compression parameters, after which the DRAM controller 110 may be powered down (block 316). If there are metadata associated with the compression algorithm, the metadata can be stored either in the registers in the compression engine for fast decompression time or in the DRAM for silicon area efficiency.

Figure 4:
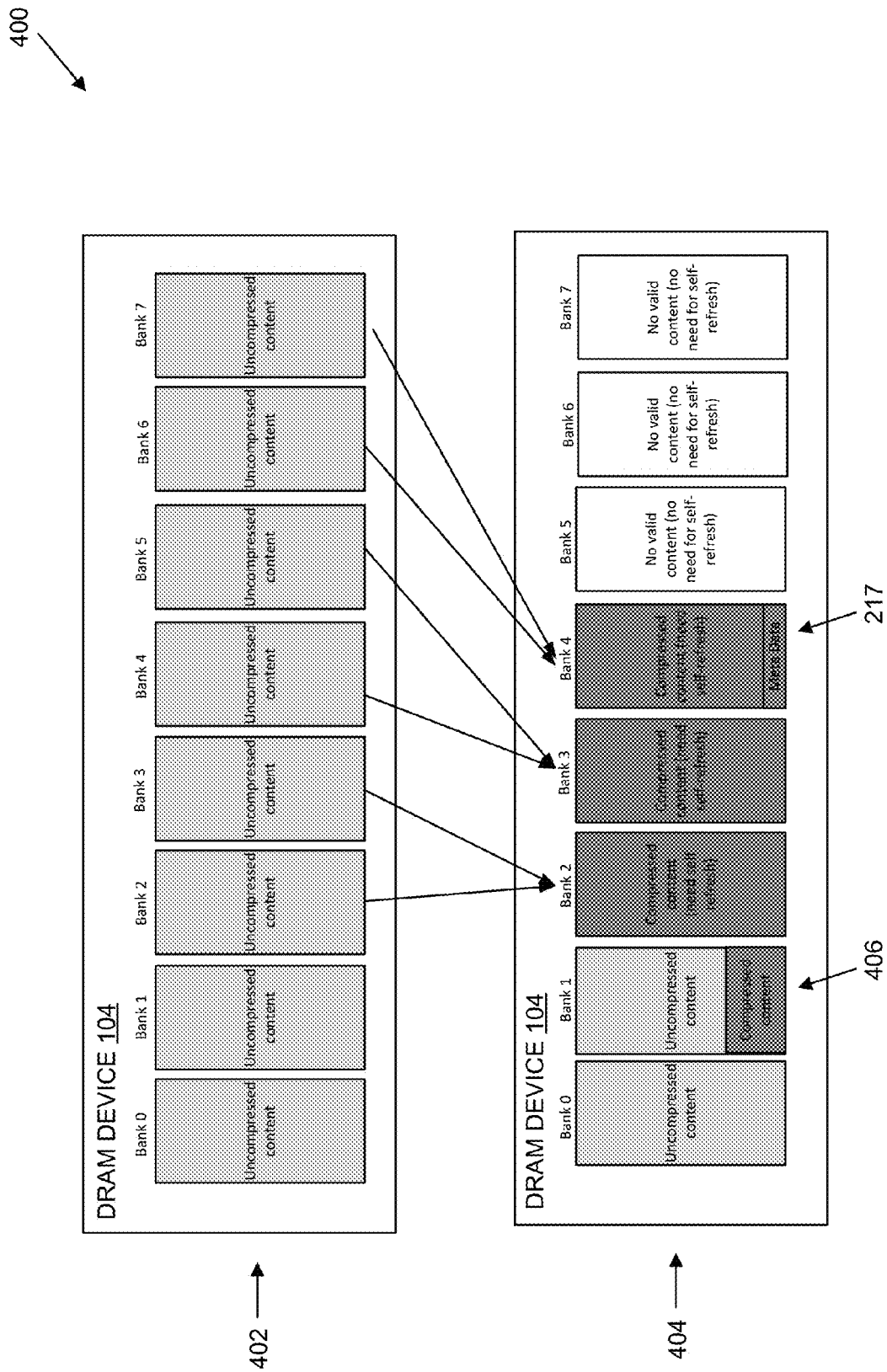
FIG. 4 is a schematic diagram illustrating an exemplary DRAM device being compressed.

FIG. 4 illustrates an exemplary DRAM device 104 in a first state 402 before compression and in a second state 404 after compression. The DRAM device 104 comprises eight banks (bank 0-bank 7) each comprising uncompressed content. The uncompressed content in banks 2 and 3 is compressed into bank 2. Banks 4 and 5 are compressed into bank 3, and banks 6 and 7 are compressed into bank 4. As illustrated in the second state 404 after compression has completed, banks 5, 6 and 7 are freed up. Because banks 5, 6 and 7 no longer contain valid content, there is no need for self-refresh to be performed on these banks. Only banks 0-4 need to be self-refreshed. It should be appreciated that the self-refresh may be disabled in various ways, including, for example, on a per bank basis for one or more banks, multiple banks, or portions or segments of one or more banks. In this manner, the power consumption for self-refresh operations during standby power mode may be reduced.

As further illustrated in FIG. 4, spill-over compressed content 406 may be stored in bank 1 with other uncompressed content making bank 1 a partially compressed bank. When the device becomes active again and the DRAM controller 110 is powered up (i.e., leaves the standby power mode), the uncompressed content (banks 0 and 1) may be read first either before or while the compressed content is being decompressed to return to state 402. The compression algorithm may also generate and store metadata 217 in one of the banks (e.g., bank 4—FIG. 4), in the spill over bank, or in one of the state registers. For compression algorithms that require the use of metadata, Metadata 217 may comprise data for controlling decompression of the compressed content. Metadata 217 may comprise the last block to be updated when compressing and the first block to be retrieved when uncompressing. For maximum power saving, the compression engine is typically configured to compress as many banks as possible, typically up to N−2 banks where N is the total number of banks in the DRAM memory. The remaining two banks are reserved as spill-over banks. These spill-over banks typically contain any O/S codes that may be needed for wakeup and frame buffer content for fast display immediately after wake up.

Figure 5:
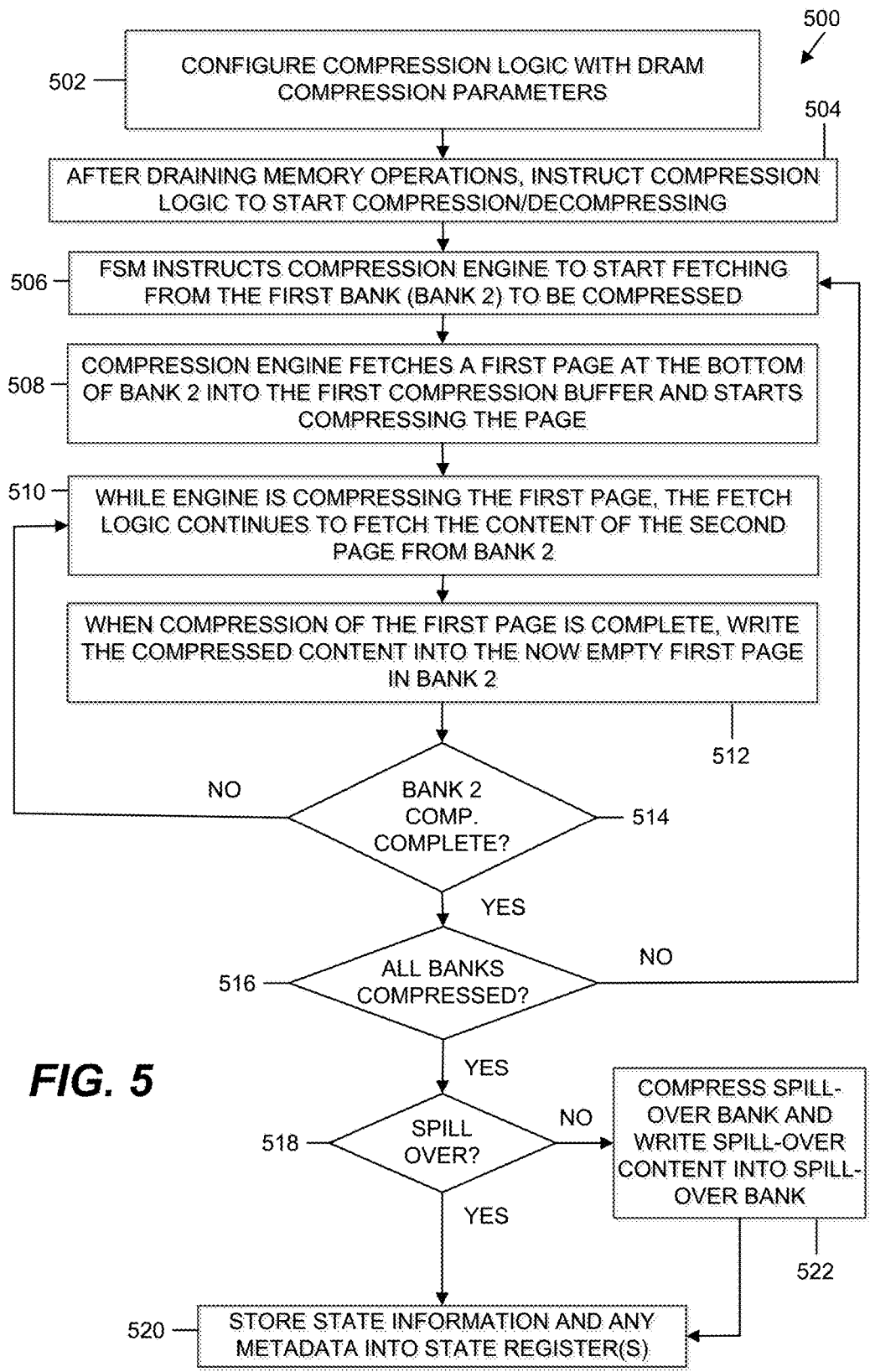
FIG. 5 is a flowchart illustrating an embodiment of a method for compressing the DRAM content.

FIG. 5 illustrates an exemplary embodiment of a method 500 for compressing content in DRAM 104 (FIG. 4). At block 502, the compression logic is configured with the compression parameters discussed above. After draining memory operations (block 306—FIG. 3), the compression engine 124 may be instructed to initiate compression based on the compression parameters. At block 506, the finite state machine 122 instructs the compression engine 124 to start fetching from the first bank to be compressed (bank 2—FIG. 4). At block 508, the compression engine 124 fetches a first page at the bottom of bank 2 into the first compression buffer (memory buffer 202—FIG. 2) and starts compressing the page. While the compression engine 124 is compressing the first page, at block 510, the fetch logic continues to fetch the content of the second page from bank 2. When compression of the first page is complete at block 512, the compressed content is written into the now empty first page in bank 2. If compression of bank 2 is not complete (decision block 514), process flow returns to block 510. When compression of bank 2 is completed, the other banks are compressed in a similar manner (decision block 516). When all banks are compressed, the bank state 126 may be updated (block 520). If there is spill-over content (decision block 518), the content is compressed and the spill-over content is written into the spill-over bank.

Figure 6:
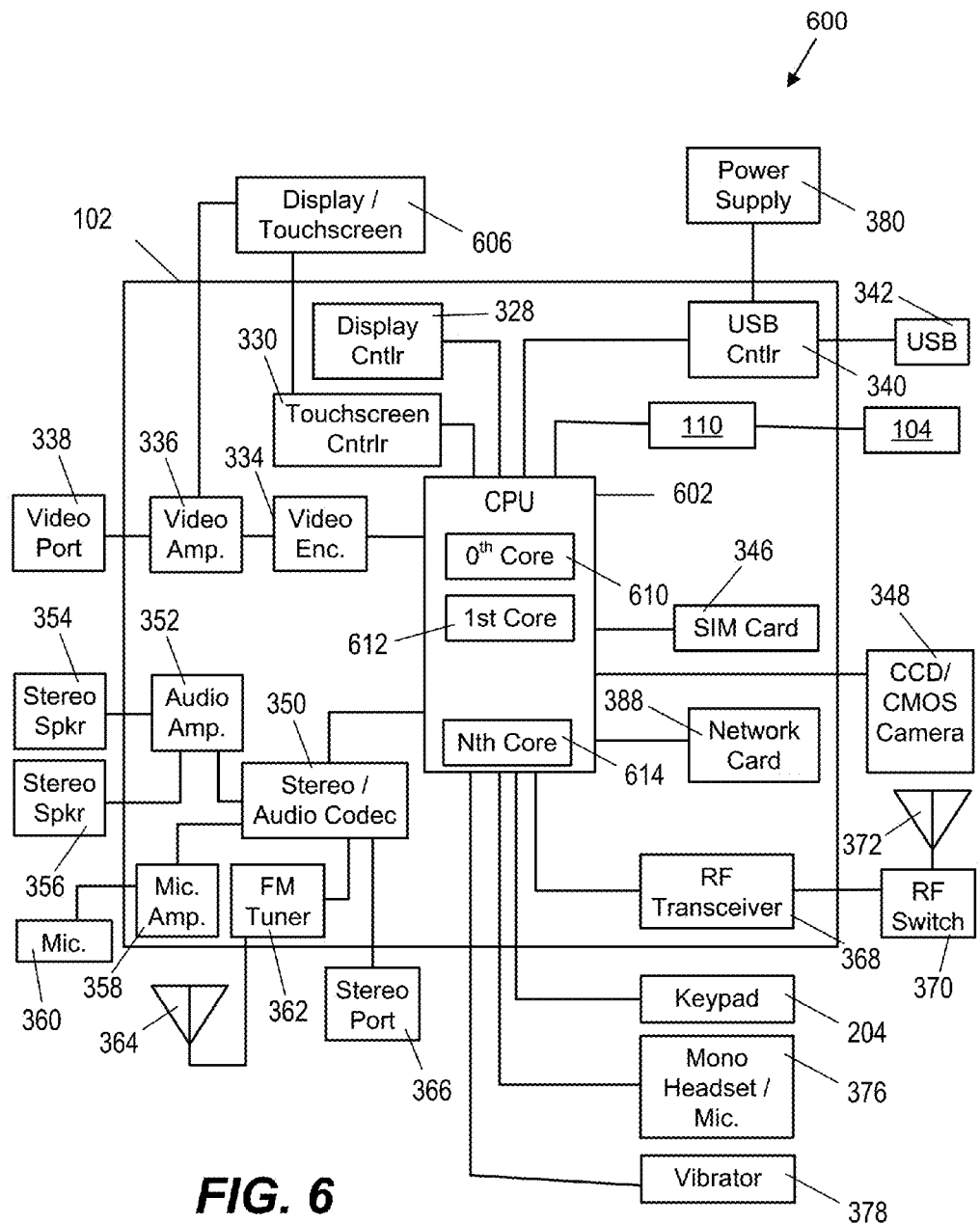
FIG. 6 illustrates the system of FIG. 1 incorporated in an exemplary portable computing device (PCD).

As mentioned above, the system 100 may be incorporated into any desirable computing system. It may be particularly advantageous to implement system 100 in portable computing devices or wearable devices where shorter sleep times make it difficult to conserve sleep power. FIG. 6 illustrates the system 100 incorporated in an exemplary portable or wearable computing device (PCD) 600. A system-on-chip (SoC) 102 comprises the DRAM controller 110. A display controller 328 and a touch screen controller 606 may be coupled to a multi-core 602 comprising a $0^{th}$ core 610, a $1^{st}$ core 612, and an nth core 614. The touch screen display 606 external to the on-chip system 102 may be coupled to the display controller 328 and the touch screen controller 330.

FIG. 6 further shows that a MPEG (Moving Pictures Expert Group) video encoder 334 is coupled to the multi-core processor 602. Further, a video amplifier 336 is coupled to the video encoder 334 and the touch screen display 606. Also, a video port 338 is coupled to the video amplifier 336. As shown in FIG. 6, a universal serial bus (USB) controller 340 is coupled to one or more of the processor clusters. Also, a USB port 342 is coupled to the USB controller 340. Memory 104 and a subscriber identity module (SIM) card 346 may also be coupled to the multi-core processor 602.

A digital camera 348 may be coupled to the multi-core processor 602. In an exemplary aspect, the digital camera 348 is a charge-coupled device (CCD) camera or a complementary metal-oxide semiconductor (CMOS) camera. A stereo audio coder-decoder (CODEC) 350 may be coupled to the multi-core processor 602. Moreover, an audio amplifier 352 may coupled to the stereo audio CODEC 350. In an exemplary aspect, a first stereo speaker 354 and a second stereo speaker 356 are coupled to the audio amplifier 352. A microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 6 further illustrates that a radio frequency (RF) transceiver 368 may be coupled to the multi-core processor 602. An RF switch 370 may be coupled to the RF transceiver 368 and an RF antenna 372. A keypad 204, a mono headset with a microphone 376, and a vibrator device 378 may be coupled to the processors 126.

FIG. 6 also shows that a power supply 380 may be coupled to the on-chip system 102. In a particular aspect, the power supply 380 is a direct current (DC) power supply that provides power to the various components of the PCD 600 that require power. Further, in a particular aspect, the power supply is a rechargeable DC battery or a DC power supply that is derived from an alternating current (AC) to DC transformer that is connected to an AC power source.

FIG. 6 further indicates that the PCD 600 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

Referring to FIG. 6, it should be appreciated that the memory 104, touch screen display 606, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 102.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or in parallel (substantially simultaneously with) with other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for reducing volatile memory standby power in a portable computing device, the method comprising:
   receiving a request for a volatile memory device to enter a standby power mode;
   determining in response to the request one or more compression parameters for compressing content stored in a plurality of banks of the volatile memory device, the one or more compression parameters specifying a number of the plurality of banks to be compressed;
   compressing the stored content associated with the number of the plurality of banks specified by the one or more compression parameters to free-up at least one of the plurality of banks; and
   disabling self-refresh of at least a portion of one or more of the plurality of banks freed-up by the compression during the standby power mode.

2. The method of claim 1, wherein the compression parameters further comprise one or more of a size of a compression block and a spill-over bank.

3. The method of claim 2, wherein the compressing the stored content further comprises writing compressed spill-over content to the spill-over bank.

4. The method of claim 1, further comprising storing compression metadata identifying a first block to be retrieved when decompressing the compressed content.

5. The method of claim 1, wherein the disabling self-fresh comprises disabling self-refresh of one or more bank segments or one or more of the plurality of banks.

6. The method of claim 1, wherein the volatile memory device comprises double data rate (DDR) memory.

7. The method of claim 6, wherein the DDR memory comprises low power DDR (LPDDR) memory.

8. The method of claim 1, wherein the portable computing device comprises one of a mobile phone and a wearable device.

9. The method of claim 1, further comprising:
storing a compression status for the plurality of banks in a finite state machine.

10. The method of claim 9, further comprising:
storing, in the finite state machine, a content block size and a start address for each compressed content block in the volatile memory device.

11. A system for reducing volatile memory standby power in a portable computing device, the system comprising:
means for receiving a request for a volatile memory device to enter a standby power mode;
means for determining in response to the request one or more compression parameters for compressing content stored in a plurality of banks of the volatile memory device, the one or more compression parameters specifying a number of the plurality of banks to be compressed;
means for compressing the stored content associated with the number of the plurality of banks specified by the one or more compression parameters to free-up at least one of the plurality of banks; and
means for disabling self-refresh of at least a portion of one or more of the plurality of banks freed-up by the compression during the standby power mode.

12. The system of claim 11, wherein the compression parameters further comprise one or more of a size of a compression block and a spill-over bank.

13. The system of claim 12, further comprising:
means for writing compressed spill-over content to the spill-over bank.

14. The system of claim 11, further comprising:
means for storing compression metadata identifying a first block to be retrieved when decompressing the compressed content.

15. The system of claim 14, wherein the means for disabling self-fresh comprises means for disabling self-refresh of one or more bank segments or one or more of the plurality of banks.

16. The system of claim 11, wherein the volatile memory device comprises double data rate (DDR) memory.

17. The system of claim 16, wherein the DDR memory comprises one of graphics DDR (GDDR) memory and low power DDR (LPDDR) memory.

18. The system of claim 11, wherein the portable computing device comprises one of a mobile phone and a wearable device.

19. The system of claim 11, further comprising:
means for storing a compression status for the plurality of banks in a finite state machine.

20. The system of claim 19, further comprising:
means for storing, in the finite state machine, a content block size and a start address for each compressed content block in the volatile memory device.

21. A computer program embodied in a non-transitory computer-readable medium and executable by a processor for reducing volatile memory standby power in a portable computing device, the computer program comprising logic configured to:
receive a request for a volatile memory device to enter a standby power mode;
determine in response to the request one or more compression parameters for compressing content stored in a plurality of banks of the volatile memory device, the one or more compression parameters specifying a number of the plurality of banks to be compressed;
compress the stored content associated with the number of the plurality of banks specified by the one or more compression parameters to free-up at least one of the plurality of banks; and
disable self-refresh of at least a portion of one or more of the plurality of banks freed-up by the compression during the standby power mode.

22. The computer program of claim 21, wherein the compression parameters further comprise one or more of a size of a compression block and a spill-over bank.

23. The computer program of claim 22, wherein the logic configured to compress the stored content further comprises logic configured to write compressed spill-over content to the spill-over bank.

24. The computer program of claim 21, further comprising:
logic configured to store compression metadata identifying a first block to be retrieved when decompressing the compressed content.

25. The computer program of claim 24, wherein the logic configured to disable self-fresh comprises logic configured to disable self-refresh of one or more bank segments or one or more of the plurality of banks.

26. A system for reducing volatile memory standby power in a portable computing device, the system comprising:
a dynamic random access memory (DRAM) device comprising a plurality of banks containing memory content; and
a DRAM controller coupled to the DRAM device, the DRAM controller comprising a DRAM compression component configured to bypass an address interleave component, the DRAM compression component comprising logic configured to:
receive a request for the DRAM device to enter a standby power mode;
determine in response to the request one or more compression parameters for compressing the memory content stored in the plurality of banks, the one or more compression parameters specifying a number of the plurality of banks to be compressed;
compress the memory content associated with the number of the plurality of banks specified by the one or more compression parameters to free-up at least one of the plurality of banks; and
disable self-refresh of at least a portion of one or more of the plurality of banks freed-up by the compression during the standby power mode.

27. The system of claim 26, wherein the compression parameters further comprise one or more of a size of a compression block and a spill-over bank.

28. The system of claim 27, wherein the logic configured to compress the memory content further comprises logic configured to write compressed spill-over content to the spill-over bank.

29. The system of claim 26, wherein the DRAM compression component further comprises:
   logic configured to store compression metadata identifying a first block to be retrieved when decompressing the compressed content.

30. The system of claim 29, wherein the logic configured to disable self-fresh comprises logic configured to disable self-refresh of one or more bank segments or one or more of the plurality of banks.

* * * * *